(12) United States Patent
Delano et al.

(10) Patent No.: US 9,300,261 B2
(45) Date of Patent: Mar. 29, 2016

(54) METHOD AND APPARATUS FOR EFFICIENT LOAD BIASING

(75) Inventors: Cary L. Delano, Los Altos, CA (US); William R. Chester, Morgan Hill, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 1844 days.

(21) Appl. No.: 11/308,200

(22) Filed: Mar. 10, 2006

(65) Prior Publication Data

US 2007/0222522 A1  Sep. 27, 2007

(51) Int. Cl.
*H03F 21/00* (2006.01)
*H03F 3/20* (2006.01)
*H03F 3/68* (2006.01)
*H04R 5/033* (2006.01)

(52) U.S. Cl.
CPC .. *H03F 3/20* (2013.01); *H03F 3/68* (2013.01); *H04R 5/033* (2013.01)

(58) Field of Classification Search
CPC ......... H03F 3/20; H03F 3/68; H03F 2200/03; H03F 3/181; H03F 3/72; H04R 5/033
USPC ........ 381/116, 120, 111, 59, 96; 330/130, 96, 330/260, 307, 125, 296; 333/124, 17.3, 32, 333/4, 5
See application file for complete search history.

(56) References Cited

U.S. PATENT DOCUMENTS

| | | | |
|---|---|---|---|
| 4,926,178 A | 5/1990 | Mallinson | |
| 5,196,853 A | 3/1993 | Abbiate et al. | |
| 5,198,817 A | 3/1993 | Walden et al. | |
| 5,598,158 A | 1/1997 | Linz | |
| 5,654,668 A | 8/1997 | Botti et al. | |
| 5,708,390 A | 1/1998 | Dunnebacke | |
| 5,768,315 A | 6/1998 | Mittel et al. | |
| 5,818,377 A | 10/1998 | Wieser | |
| 5,841,822 A | 11/1998 | Mittel et al. | |
| 6,107,886 A | 8/2000 | Kusakabe et al. | |
| 6,137,431 A | 10/2000 | Lee et al. | |
| 6,215,356 B1 * | 4/2001 | Servaes et al. | 330/251 |
| 6,218,977 B1 | 4/2001 | Friend et al. | |
| 6,249,236 B1 | 6/2001 | Lee et al. | |
| 6,323,729 B1 * | 11/2001 | Sevenhans et al. | 330/51 |
| 6,489,913 B1 | 12/2002 | Hansen et al. | |
| 6,496,128 B2 | 12/2002 | Wiesbauer et al. | |
| 6,611,221 B1 | 8/2003 | Soundarapandian et al. | |
| 6,642,873 B1 | 11/2003 | Kuang | |
| 6,696,999 B2 | 2/2004 | Ollos et al. | |
| 6,697,003 B1 | 2/2004 | Chen | |
| 6,825,784 B1 | 11/2004 | Zhang | |
| 6,839,010 B1 | 1/2005 | Tsyrganovich | |

(Continued)

*Primary Examiner* — Vivian Chin
*Assistant Examiner* — Con P Tran

(57) ABSTRACT

A system for driving a plurality of loads each connected to respective signal terminals and to a shared common load terminal. Multiple conventional signal amplifiers each provide a content signal at one of the signal terminals. The signal amplifiers each have a primary-power upper terminal, to receive a first voltage ($V_1$) from a first power supply, and a primary-power lower terminal, to receive a second voltage ($V_2$) from the first power supply. A bias amplifier biases the common load terminal, and has a secondary-power upper terminal to receive a third voltage ($V_3$) from a second power supply and a secondary-power lower terminal to receive a fourth voltage ($V_4$) from the second power supply, wherein $V_2 \leq V_4 < V_3 \leq V_1$.

19 Claims, 3 Drawing Sheets

(56) References Cited

U.S. PATENT DOCUMENTS

| | | |
|---|---|---|
| 6,856,266 B2 | 2/2005 | Clement et al. |
| 6,888,358 B2 | 5/2005 | Lechner et al. |
| 6,888,484 B2 | 5/2005 | Kiss et al. |
| 6,891,488 B1 | 5/2005 | McDaniel et al. |
| 6,897,796 B2 | 5/2005 | Dias et al. |
| 6,907,374 B1 | 6/2005 | Tsyrganovich |
| 6,924,756 B2 | 8/2005 | Viswanathan |
| 6,975,259 B1 | 12/2005 | Jensen |
| 6,980,139 B2 | 12/2005 | Doerrer et al. |
| 6,998,910 B2 | 2/2006 | Hezar et al. |
| 7,015,843 B2 | 3/2006 | Jelonnek |
| 7,024,171 B2 | 4/2006 | Gibbs |
| 7,030,797 B2 | 4/2006 | Jelonnek |
| 7,049,990 B2 | 5/2006 | Ranganathan |
| 7,064,698 B2 | 6/2006 | Locher et al. |
| 7,068,197 B1 | 6/2006 | Tsyrganovich |
| 7,068,198 B2 | 6/2006 | Hong et al. |
| 7,123,177 B2 | 10/2006 | Cheng et al. |
| 7,142,142 B2 | 11/2006 | Petersen et al. |
| 7,548,178 B2 | 6/2009 | Delano |
| 7,557,658 B2 * | 7/2009 | Perez ............................ 330/255 |
| 2005/0068213 A1 | 3/2005 | Fontaine et al. |
| 2005/0237233 A1 | 10/2005 | Muhammad |
| 2006/0071834 A1 | 4/2006 | del Mar Charmarro Marti et al. |
| 2006/0261901 A1 | 11/2006 | Mazda et al. |

* cited by examiner

METHOD AND APPARATUS FOR EFFICIENT LOAD BIASING

TECHNICAL FIELD

The present invention relates generally to electrical audio signal processing systems and devices, and more particularly to such including a device for producing an output of greater power drive capability than is applied at an input for use with stereo headphone and earphone circuits.

BACKGROUND ART

Many audio systems today can be used with stereo headphones or earphones (collectively "headphones" hereinafter). In fact, many existing and emerging classes of audio systems today are intended to be used either predominantly or only with headphones, and this is particularly so for systems that are designed to be portable or wearable. Some noteworthy examples today are MP3/4 music players, CD players, and personal sound recorders/players generally. In these systems especially, and as part of an ongoing trend towards smaller and more efficient electronic devices, reducing overall system size and power consumption are often also important considerations.

In most of these audio systems a 3-wire signal feed to the headphones is employed, wherein each of two stereo signals is carried via an individual wire and a third common wire. The connection points for these wires to the audio system proper are usually termed a "left signal terminal," a "right signal terminal," and a "common load terminal." The left and right stereo signals thus pass through the left and right signal terminals, and a voltage used to bias the speaker elements within the headphones is present at the shared common load terminal. Usually the bias voltage is designed to be nominally half of the main direct current (DC) supply voltage, since this permits achieving maximum dynamic range during sound playback.

Unfortunately, designing a mechanism to suitably bias the common load terminal in this manner in an audio system can be problematical, especially for a 3-wire signal feed to headphones. This is because it is usually necessary to concurrently prevent DC from flowing through the common load terminal to the system ground. Since the common load terminal is in the current path through the headphones and the signal amplifiers that drive them, any undue current flow here can potentially damage these elements and is generally wasteful of power.

FIGS. 1-3 (prior art) are schematic block diagrams depicting some typical headphone driver circuits. One common prior art circuit 10 for this application is shown in FIG. 1. Here, left and right sub-circuits (shown stylistically simply as signal amplifiers 12, 14) provide left and right channel stereo signal content, via left and right signal terminals 16, 18, to left and right speaker elements 20, 22. The speaker elements 20, 22 are both further connected to a common load terminal 24, thus forming the typical 3-wire configuration discussed above.

A key element in circuit 10 is a capacitor 26, which connects the common load terminal 24 to a system ground 28. This capacitor 26 performs DC blocking, preventing the undesirable flow of DC from the common load terminal 24 to the system ground 28. Concurrently, however, the capacitor 26 must still generally permit desired signal content (as alternating current (AC)) to flow through the speaker elements 20, 22 and to the system ground 28. Theoretical current paths 30 are stylistically depicted in FIG. 1 in ghost outline.

To pass the full desired frequency range through the speaker elements 20, 22 the capacitor 26 usually needs to have quite a high value, and this is a major problem with circuit 10. For example, in common audio design practice it is desirable to pass 25 Hz stereo signal content with less than 3 dB of attenuation and to pass 100 Hz content with essentially no attenuation. For the sake of this example some common supply voltage levels and headphone impedances are also shown in FIG. 1. From all of this it follows that the value of the capacitor 26 usually needs to be on the order of 200-400 µF (micro farads). The capacitor 26 thus tends to be physically large and expensive, and tends to appreciably increase the size and cost of audio systems that employ this approach.

FIG. 2 shows the most common prior art circuit 40 for driving headphones, albeit one conceptually much the same as the approach of circuit 10. Rather than use one DC-blocking capacitor, two capacitors 42a, 42b are used here instead, one per audio channel. Unfortunately, for readily apparent reasons, circuit 40 suffers from the same problems as circuit 10.

FIG. 3 shows yet another prior art circuit 50 that is frequently used for common load terminal biasing. Here the need for a DC-blocking capacitor in the path connecting the headphones to ground is eliminated by the use of a third amplifier, a bias amplifier 52, which actively drives the bias level of the common load terminal 24. The amplifiers 12, 14, 52 in this arrangement drive the loads presented by the speaker elements 20, 22. Amplifier 52 holds the DC bias on the common load terminal 24.

The approach in circuit 50 conveniently eliminates the need for one or more large, expensive DC-blocking capacitors that consume circuit board space and cause low-frequency performance degradation. Since circuit 50 biases the differential outputs of the amplifiers 12, 14, 52 at mid-supply, there advantageously is no resulting net DC voltage across the speaker elements 20, 22. But the use of three amplifiers 12, 14, 52 in this manner to drive the loads presented by the speaker elements 20, 22 also roughly doubles the power required and which then has to be dissipated. This is generally undesirable and for some applications, such as battery powered audio systems, is a severe disadvantage.

Accordingly, what is needed is an approach to load biasing that does not require substantial additional power yet still eliminates the need for DC-blocking capacitors, i.e., a more efficient approach to load biasing.

DISCLOSURE OF INVENTION

Accordingly, it is an object of the present invention to provide a more efficient approach to load biasing.

Briefly, one preferred embodiment of the present invention is a circuit for driving a plurality of loads each connected to respective signal terminals and to a shared common load terminal. A plurality of conventional signal amplifiers each provide a content signal at one of the signal terminals. The signal amplifiers each have a primary-power upper terminal, to receive a first voltage ($V_1$) from a first power supply, and a primary-power lower terminal, to receive a second voltage ($V_2$) from the first power supply. A bias amplifier biases the common load terminal and has a secondary-power upper terminal, to receive a third voltage ($V_3$) from a second power supply, and a secondary-power lower terminal to receive a fourth voltage ($V_4$) from the second power supply, wherein $V_2 \leq V_4 < V_3 \leq V_1$.

Briefly, another preferred embodiment of the present invention is a method for driving a plurality of loads each connected to respective signal terminals and to a shared common load terminal. A first voltage ($V_1$) and a second voltage ($V_2$) are provided from a first power supply, and a third voltage ($V_3$) and a fourth voltage ($V_4$) are provided from a second power supply, wherein $V_2 \leq V_4 < V_3 \leq V_1$. Multiple input signals are amplified to provide respective content signals, each at a respective signal terminal, wherein the amplification is powered with $V_1$, and $V_2$ from the first power supply. The common load terminal is biased with a bias amplifier that is powered, at least primarily, with $V_3$ and $V_4$ from the second power supply.

And briefly, another preferred embodiment of the present invention is an improved circuit for biasing multiple loads of the type in which each of the loads are each connected to a respective signal terminal and a shared common load terminal. Multiple conventional signal amplifiers each provide a content signal at a respective signal terminal, wherein each signal amplifier is powered with a first voltage ($V_1$) and a second voltage ($V_2$) from a first power supply and a bias amplifier provides bias at the common load terminal. The improvement comprises a second power supply to power the bias amplifier with a third voltage ($V_3$) and a fourth voltage ($V_4$), wherein $V_2 \leq V_4 < V_3 \leq V_1$.

An advantage of the present invention is that it eliminates the need for one or more large, expensive DC-blocking capacitors in the path connecting audio system headphones to ground, thus freeing up the circuit board space such would require, and also removing such as a potential source of low-frequency performance degradation.

Another advantage of the invention is that it substantially mitigates the doubling of the power required by use of a third, biasing amplifier used instead of DC-blocking capacitors, thus making the invention particularly suitable for use with battery powered audio systems.

Another advantage of the invention is that it works especially well for audio systems employing a 3-wire signal feed to headphones or speaker elements.

And another advantage of the invention is that it works will within the framework of conventional audio system best practices, such as keeping a common headphones terminal at half of the main DC supply voltage, to achieving maximum dynamic range during sound playback, and preventing DC from flowing through this common load terminal to the system ground and potentially damaging circuit elements or being generally wasteful of power.

These and other objects and advantages of the present invention will become clear to those skilled in the art in view of the description of the best presently known mode of carrying out the invention and the industrial applicability of the preferred embodiment as described herein and as illustrated in the figures of the drawings.

BRIEF DESCRIPTION OF THE DRAWINGS

The purposes and advantages of the present invention will be apparent from the following detailed description in conjunction with the appended figures of drawings in which.

In the various figures of the drawings, like references are used to denote like or similar elements or steps.

BEST MODE FOR CARRYING OUT THE INVENTION

Figure 1:
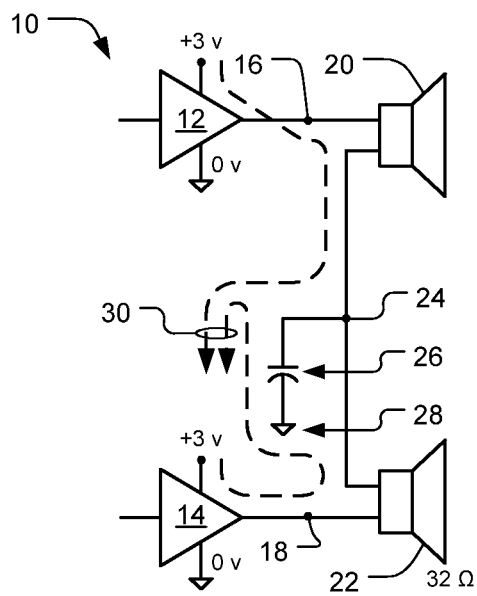
FIG. 1 (prior art) is a schematic block diagram depicting a headphone driver circuit employing a single DC-blocking capacitor.

A preferred embodiment of the present invention is an efficient load biasing system. As illustrated in the various drawings herein, and particularly in the views of FIGS. 4-6, preferred embodiments of the invention are depicted by the general reference character 100.

Where appropriate, reference symbols are reused and peripheral conventional circuit elements are omitted for clarity. In the following discussion reference back to FIGS. 1-3 (prior art) is also frequently make for the sake of comparison.

Figure 3:
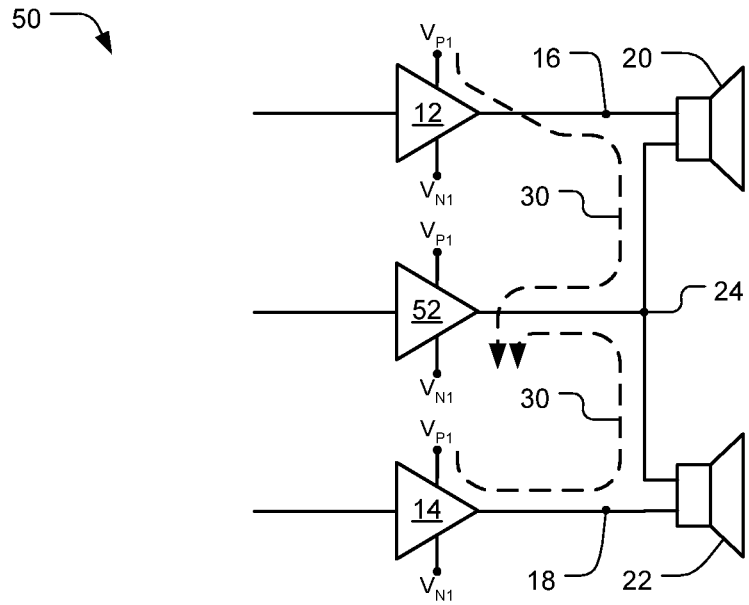
FIG. 3 (prior art) is a schematic block diagram depicting a headphone driver circuit employing a common load terminal biasing amplifier.
Figure 4:
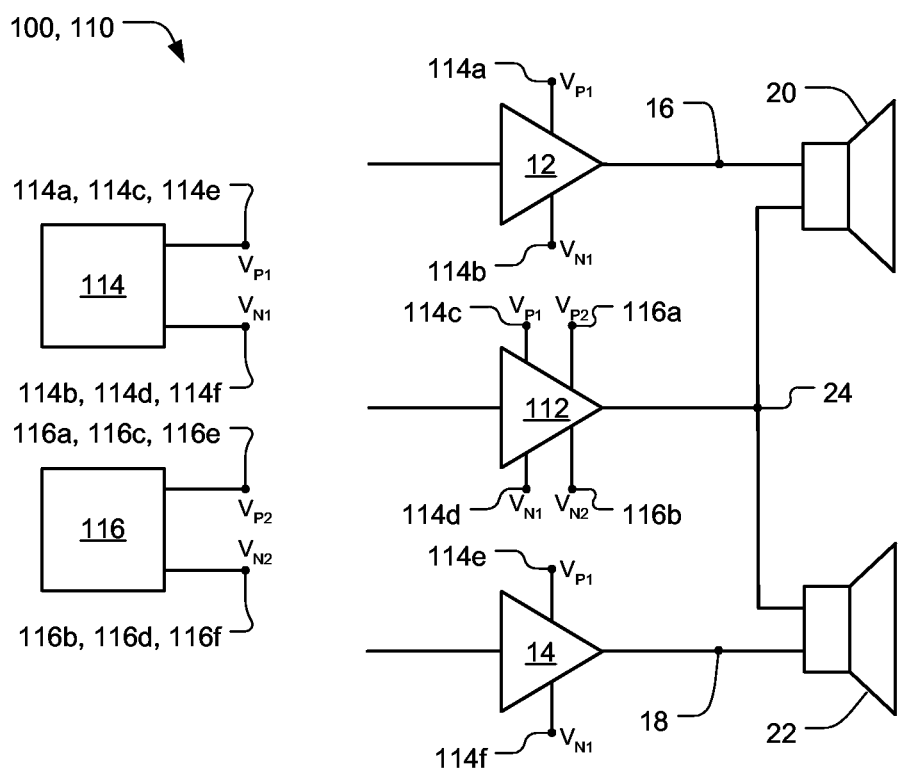
FIG. 4 is a schematic block diagram depicting a first embodiment of a load biasing system that is accord with the present invention.

FIG. 4 is a schematic block diagram depicting a load biasing system 100, here specifically a circuit 110 that is accord with the present invention. The circuit 110 includes signal amplifiers 12, 14 and left and right speaker elements 20, 22. It also includes left and right signal terminals 16, 18 and a common load terminal 24. These features can be entirely conventional and thus can be exactly the same as those used in prior art approaches (see e.g., FIGS. 1-3). The circuit 110 further includes a bias amplifier 112, a first power supply 114, and a second power supply 116. The power supplies, which may be conventional in all respects, are represented primarily in the figures as terminals 114a-f, 116a-f.

We turn briefly now into a discussion of amplifier types as these relate to the prior art and to embodiments of the inventive load biasing system 100. Generally, a Class-A amplifier is defined to be one in which a single transistor conducts during an entire cycle (360 degrees) of the input signal. Class-A amplifiers are inefficient but are nonetheless widely used for low-power and high-end stereo applications.

Class-B amplifiers are germane here only to the extent they relate to hybrid arrangements with Class-A amplifiers. In a Class B amplifier current flows only for half of a cycle (180°), or two transistors can be used in a push-pull fashion, each one operating for 180°. This arrangement is more efficient than Class A but it is typically used in low-end products.

Class-AB amplifiers combine the principles of Class-A and Class-B, so that current flows for 180° to 200°. While some references still state that Class-A designs are the most widely used for audio applications, that is arguable and Class-AB designs may now predominate.

Class G amplifiers are a variation of Class AB that improves efficiency by switching to different fixed voltages as the input signal approaches those voltage levels. Thus, unlike Class-A and Class-AB amplifiers, which are single-supply devices, Class G amplifiers are multiple-supply devices. Class-G amplifiers are not widely encountered, although some authorities argue that they have been commonly known since at least 1965.

Finally, Class-H amplifiers are an enhancement of the Class-G amplifier, in which the power supply voltage is modulated and always slightly higher than the input signal. Class-H amplifiers thus are a sub-class of Class-G, and both are generally referred to herein as "Class-G."

Returning to present considerations, in many audio systems today, Class-A amplifiers (with a single-supply) are used for the signal amplifiers 12, 14, as well as for a bias amplifier 52 if one is used. Single-supply Class-AB amplifiers (also with a single-supply) can alternately be used as any or all of amplifiers 12, 14, 52. Class-G amplifiers (with multiple supplies) are occasionally used for the signal amplifiers 12, 14. However, to the that instant inventors are presently aware, all prior art audio systems where Class-G have been used for the signal amplifiers 12, 14 are designs where DC-blocking capacitors are used to control common load terminal biasing.

Figure 2:
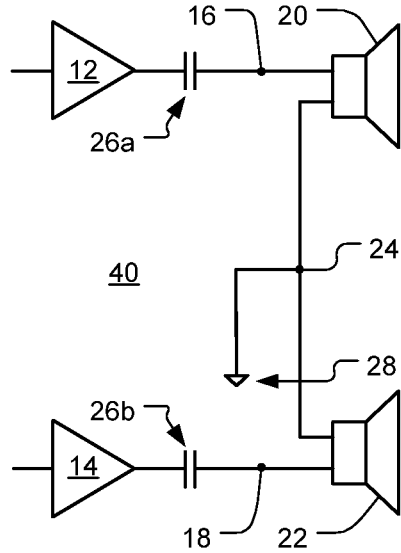
FIG. 2 (prior art) is a schematic block diagram depicting a headphone driver circuit employing dual DC-blocking capacitors.

With reference again to FIG. 4, differences between it and FIGS. 1-2 are obvious. The circuit 110 in FIG. 4 does not include DC-blocking capacitors. It accordingly does not suffer from the limitations and disadvantages that come with such.

The difference between FIG. 4 and FIG. 3 is somewhat more subtle. The bias amplifier 112 in FIG. 4 is a Class-G type, powered by the two power supplies 114, 116. The main first power supply 114 is used generally to power other components of the underlying audio system (not shown), and here specifically to power all of the amplifiers 12, 14, 112 (at terminals 114a-b, 114c-d, 114e-f, respectively)($V_{P1}$ and $V_{N1}$). The second power supply 116 here powers only the bias amplifier 112 (specifically at terminals 116a-b)($V_{P2}$ and $V_{N2}$).

The bias amplifier 112 actively drives the bias level of the common load terminal 24, thus conceptually performing the same task as the bias amplifier 52 in prior art circuit 50 in FIG. 3. Unlike that and other prior art, however, the bias amplifier 112 does this much more efficiently, with the increase in overall efficiency proportional to the efficiency of the Class-G amplifier used. Since there is no signal present on the common load terminal 24, the bias amplifier 112 is able to operate primarily or even exclusively by drawing power from only the second power supply, via terminals 116a-b. Thus, by making the voltage ($V_{P2}$ and $V_{N2}$) of the second power supply close to the bias voltage required at the common load terminal 24, maximum efficiency will be achieved. For instance, $V_{N1}$=0 volts, $V_{P1}$=+3 volts, $V_{N2}$=+0.75 volts, and $V_{P2}$=+2.25 volts might be used. Since the bias amplifier 112 will be operating with 1.5 volts rather than 3 volts, yet still be able to perform its role, it will consume less power and the circuit 110 will accordingly be more efficient.

Figure 5:
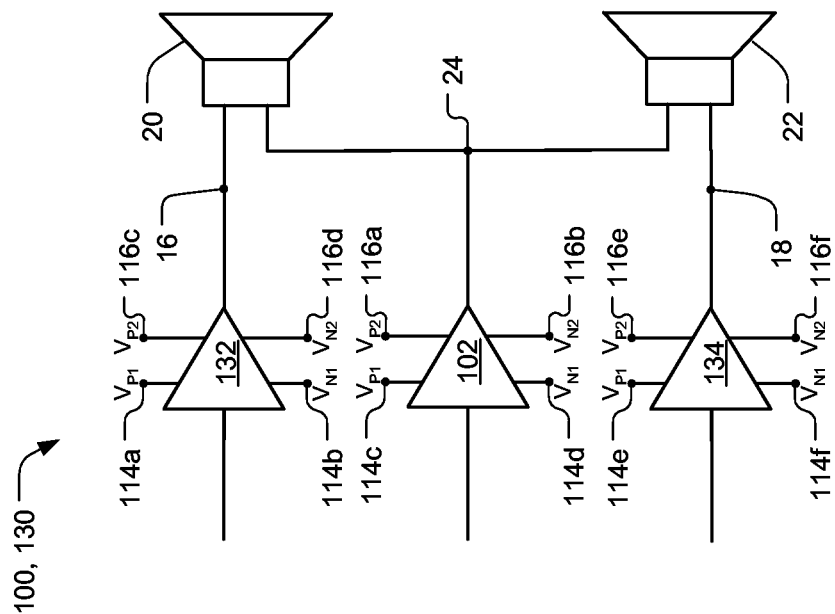
FIG. 5 is a schematic block diagram depicting a second embodiment of a load biasing system that is accord with the present invention.

FIG. 5 is a schematic block diagram depicting another embodiment of a load biasing system 100, here specifically a circuit 130 that is accord with the present invention. The circuit 130 includes a number of the same elements as in the previous figures, e.g., speaker elements 20, 22, signal terminals 16, 18, common load terminal 24, and two power supplies (here simply represented with terminals 114a-f, 116a-f). These features can all be as already described, i.e., entirely conventional. The circuit 130 also includes the bias amplifier 112 again, which is used in the very same manner as it is used in FIG. 4. Unlike FIG. 4, however, the circuit 130 includes signal amplifiers 132, 134 that are Class-G (or Class-H) type amplifiers.

The rationale for this is as follows: since a Class-G type amplifier is being used for biasing the common load terminal 24, and since this requires the presence of multiple power supplies (or a specialized supply in the case of Class-H), and since Class-G is more efficient than Class-AB or Class-A, it follows that an audio system designer might want to go ahead and use Class-G amplifiers throughout because the power supplies to use these instead of more traditional but less efficient types are now present.

Figure 6:
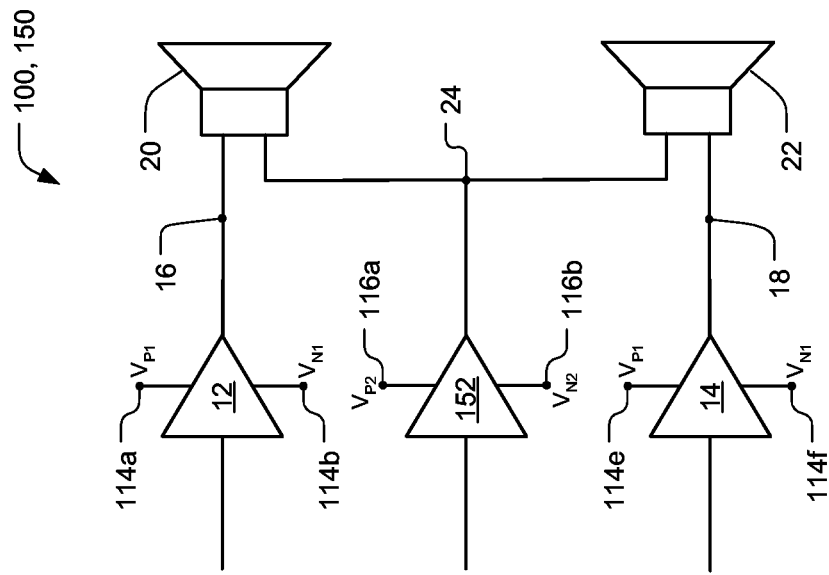
FIG. 6 is a schematic block diagram depicting a third embodiment of a load biasing system that is accord with the present invention.

FIG. 6 is a schematic block diagram depicting another embodiment of a load biasing system 100, here specifically a circuit 150 that is accord with the present invention. The circuit 110 includes a number of the same elements as in the previous figures, e.g., signal amplifiers 12, 14, speaker elements 20, 22, signal terminals 16, 18, common load terminal 24, and two power supplies (again here simply represented as terminals 114a-b, 114e-f, 116a-b). These features can all be entirely conventional and can therefore be exactly the same as those previously discussed.

The circuit 150 further includes a bias amplifier 152 to actively drive the bias level of the common load terminal 24. Unlike the bias amplifier 112 in FIG. 4, which is a Class-G amplifier power by both of the power supplies, the bias amplifier 152 here is a Class-A or Class-AB amplifier power by only the second power supply via terminals 116a-b ($V_{P2}$ and $V_{N2}$). Since there is no signal present on the common load terminal 24 and the voltage needed for biasing the common load terminal 24 should normally always fall within the range $V_{P2}$-$V_{N2}$ (wherein $V_{N1} \leq V_{N2} < V_{P2} \leq V_{P1}$), there is no need to even connect the first power supply to the amplifier used for biasing the common load terminal 24. Accordingly, the bias amplifier 152 here can be a single-supply type like Class-A or Class-AB. Furthermore, the inventors anticipate that Class-AB will be the usual design choice over Class-A for most embodiments of the invention that use this approach because Class-AB amplifiers are more efficient than Class-A amplifiers.

Finally, it should also be appreciated that the inventive load biasing system 100 here can also use single ended power supplies. For example, in the circuits 110, 130, 150 the first power supply 114 could provide $V_{p1}$>0 VDC and $V_{N1}$=0 VDC and the second power supply 116 could provide $V_{P2}$>0 VDC and $V_{N2}$=0 VDC (i.e., $0 \leq 0 < V_{P2} \leq V_{p1}$). Alternately, the first power supply 114 could provide $V_{p1}$=0 VDC and $V_{N1}$<0 VDC and the second power supply 116 could provide $V_{P2}$=0 VDC and $V_{N2}$<0 VDC (i.e., $V_{N1} \leq V_{N2} < 0 \leq 0$).

While various embodiments have been described above, it should be understood that they have been presented by way of example only, and that the breadth and scope of the invention should not be limited by any of the above described exemplary embodiments, but should instead be defined only in accordance with the following claims and their equivalents.

INDUSTRIAL APPLICABILITY

The present load biasing system 100 is well suited for application in audio systems. As has been discussed herein, it eliminates the need for one or more large, expensive DC-blocking capacitors in the path connecting headphones to ground. This accordingly frees circuit board space and permits reducing the ultimate size of the audio system. This also removes a potential source of low-frequency performance degradation.

While the load biasing system 100 uses a third amplifier, for biasing, rather than DC-blocking capacitors, it does this with a novel approach that eliminates many of the disadvantages that prior art three-amplifier schemes suffer from. For example, the inventive approach somewhat increases power consumption, but not on the order of the roughly doubling of power used by such prior art schemes require.

The load biasing system 100 works especially well for audio systems employing a 3-wire signal feeds to headphones or speaker elements, such as MP3/4 music players, CD players, personal sound recorders/players, and portable and battery powered devices generally. And the invention also permits designers to stay within audio system best practices, such as biasing headphone common terminals at half of the main DC supply voltage yet not allowing DC to flow to ground through this terminal and circuit elements to potentially damage such elements or waste power.

Furthermore, the load biasing system 100 can employ essentially conventional and well understood electronic components, albeit in a novel combination and manner. Accordingly, practitioners of ordinary skill, once having studied this disclosure, should be able to implement embodiments of the invention and industry should be able to quickly start to realize it benefits.

For the above, and other, reasons, it is expected that the load biasing system 100 of the present invention will have widespread industrial applicability and it is therefore expected that the commercial utility of the present invention will be extensive and long lasting.

What is claimed is:

1. A circuit for driving a plurality of loads, said circuit comprising:
   a first signal amplifier operable to supply a first content signal to a first terminal of a first load of said plurality of loads;
   a second signal amplifier operable to supply a second content signal to a second terminal of a second load of said plurality of loads, wherein said first and second signal amplifiers are configured to operate using a first voltage difference provided by a first power supply; and
   a bias amplifier operable to bias a third terminal of said first load and a fourth terminal of said second load with a bias signal of a bias voltage level, wherein said bias amplifier is configured to bias using a second voltage difference provided by a second power supply that is less than said first voltage difference, wherein said second voltage difference is close to said bias voltage level, wherein said second power supply includes at least one grounded terminal.

2. The circuit of claim 1, wherein said bias amplifier is configured to operate using a first upper supply voltage provided by said second power supply, wherein said first and second amplifiers are configured to operate using a second upper supply voltage provided by said first power supply, and wherein said first upper supply voltage is less than said second upper supply voltage.

3. The circuit of claim 1, wherein said bias amplifier is a Class-A amplifier.

4. The circuit of claim 1, wherein said bias amplifier is a Class-AB amplifier.

5. The circuit of claim 1, wherein said first and second amplifiers are selected from a group consisting of a plurality of Class-A amplifiers and a plurality of Class-AB amplifiers.

6. The circuit of claim 1, wherein said plurality of loads are speakers.

7. A method of driving a plurality of loads, said method comprising:
   supplying a first content signal to a first load using a first signal amplifier, wherein said first signal amplifier is coupled to a first terminal of said first load;
   supplying a second content signal to a second load using a second signal amplifier, wherein said second signal amplifier is coupled to a second terminal of said second load, wherein said first and second signal amplifiers are configured to operate using a first voltage difference provided by a first power supply; and
   biasing, using a bias amplifier, a third terminal of said first load and a fourth terminal of said second load with a bias signal of a bias voltage level, wherein said bias amplifier is configured to bias using a second voltage difference provided by a second power supply that is less than said first voltage difference, wherein said second voltage difference is close to said bias voltage level, wherein said second power supply includes at least one grounded terminal.

8. The method of claim 7, wherein said bias amplifier is configured to operate using a first upper supply voltage provided by said second power supply, wherein said first and second amplifiers are configured to operate using a second upper supply voltage provided by said first power supply, and wherein said first upper supply voltage is less than said second upper supply voltage.

9. The method of claim 7, wherein said bias amplifier is a Class-A amplifier.

10. The method of claim 7, wherein said bias amplifier is a Class-AB amplifier.

11. The method of claim 7, wherein said first and second amplifiers are selected from a group consisting of a plurality of Class-A amplifiers and a plurality of Class-AB amplifiers.

12. The method of claim 7, wherein said plurality of loads are speakers.

13. A system comprising:
   a first power supply;
   a second power supply;
   a first signal amplifier operable to supply a first content signal to a first terminal of a first load of said plurality of loads, wherein said first signal amplifier is powered by said first power supply;
   a second signal amplifier operable to supply a second content signal to a second terminal of a second load of said plurality of loads, wherein said second signal amplifier is powered by said first power supply, wherein said first and second signal amplifiers are configured to operate using a first voltage difference provided by said first power supply; and
   a bias amplifier operable to bias a third terminal of said first load and a fourth terminal of said second load with a bias signal of a bias voltage level, wherein said bias amplifier is powered by said second power supply, and wherein said bias amplifier is configured to bias using a second voltage difference provided by said second power supply that is less than said first voltage difference, wherein said second voltage difference is close to said bias voltage level, wherein said second power supply includes at least one grounded terminal.

14. The system of claim 13, wherein said bias amplifier is configured to operate using a first upper supply voltage provided by said second power supply, wherein said first and second amplifiers are configured to operate using a second upper supply voltage provided by said first supply, and wherein said first upper supply voltage is less than said second upper supply voltage.

15. The system of claim 13, wherein said bias amplifier is a Class-A amplifier.

16. The system of claim 13, wherein said bias amplifier is a Class-AB amplifier.

17. The system of claim 13, wherein said first and second amplifiers are selected from a group consisting of a plurality of Class-A amplifiers and a plurality of Class-AB amplifiers.

18. The system of claim 13, wherein said plurality of loads are speakers.

19. The system of claim 13, wherein said bias amplifier is powered exclusively by said second power supply.

* * * * *